United States Patent [19]

Deslandes et al.

[11] Patent Number: 4,843,059
[45] Date of Patent: Jun. 27, 1989

[54] SUPERCONDUCTIVE MIXED VALENCE COPPER OXIDE, AND METHOD OF MAKING IT

[75] Inventors: Francis Deslandes, Saint Ouen; Claude Michel, Herouville Saint Clair; Jackie Provost, Villons Les Buissons; Bernard Raveau, Beuville; André Sulpice; Jean-Louis Tholence, both of Grenoble; Bernard Chevalier, Talence, all of France

[73] Assignee: Compagnie Generale D'Electricite, Paris Cedex, France

[21] Appl. No.: 166,548

[22] Filed: Mar. 10, 1988

[30] Foreign Application Priority Data

Mar. 19, 1987 [FR] France ............ 87 03847

[51] Int. Cl.$^4$ .......... C01F 17/00; C01G 3/02; C01G 29/00; H01L 39/12
[52] U.S. Cl. .............. 505/1; 156/DIG. 63; 252/518; 252/521; 423/263; 423/593; 423/617; 501/126; 501/152; 502/354
[58] Field of Search ........... 423/263, 593, 604, 617, 423/635; 501/123, 126, 152; 252/518, 521; 505/1, 809; 502/354; 156/DIG. 63

[56] References Cited

PUBLICATIONS

Shaplygin, I. S. et al., *Russian Journal of Inorganic Chemistry* vol. 24 No. 6, 1979 pp. 820–824.
Nguyen, N. et al., *Journal of Solid State Chemistry* vol. 39 1981 pp. 120–127.
Michel, C. et al., *Journal of Solid State Chemistry* vol. 43 pp. 73–80 (1982).
Nguyen, N. et al., *J. Phys. Chem. Solids* vol. 44 No. 5 pp. 389–400 1983.
Er-Rakho et al., *Journal of Solid State Chemistry* vol. 37 pp. 151–156 1981.
Rao et al., *Current Science* vol. 56 No. 2 pp. 47–49 Jan. 20, 1987.
Fang et al., *Mat. Res. Bull.*, vol. 22 pp. 249–252 Feb. 1987.
McKinnon et al., *Extended Abstracts than Te Spercon-ductors* 1987 Spring Meeting of the MRS (Apr. 1987).
Michel, C. et al., *Reviue de Chimie Minerale* t. 21, 1984 pp. 407–425.
Bednorz, J. G. et al. *Z. Phys. B.–Condensed Matter* vol. 64 pp. 189–193 (1986).
Capone, D. W. et al., *Applied Physics Letters* vol. 50 No. 9 pp. 543–544 Mar. 2, 1987.
Wu, M. K. et al. *Physical Review Letters* vol. 58 No. 9 pp. 908–910 Mar. 2, 1987.
Felner, I. *Solid State Communications* vol. 62 No. 12 pp. 791–794 1987.
Kishio, K. et al., *Japanese Journal of Applied Physics* vol. 26 No. 4 pp. L391–L393 Apr. 1987.
Chem Abs. CA107(18):166783k Zhon et al., 1987.
Chem. Abs. CA107(26):248006y Phatak, G. et al., 1987.
Chem. Abs. CA108(4):30178a Kilcoyne, S. et al., 1987.
Chem. Abs. CA108(10):86057g Michel C. et al., 1987.
Chem Abs. CA108(12):104700t Grover et al., 1987 (Mar. ?).
Chem Abs. CA108(18):159680s Gopalakrishnan et al., 1987.
Chem Abs. CA108(20):178140g Yakhim et al., 1987 (Mar. ?).
Chem Abs. CA108(26):230275w Mori K. et al., 1987 (Dec.).
Science, vol. 235, Mar. 6, 1987, pp. 1196–1198, Lancaster, US; P. W. Anderson: "The resonating valence bond state in La2CuO4 and superconductivity".
Physical Review Letters, vol. 58, No. 4, Jan. 26, 1987; pp. 408–410, The American Physical Society, New York, US; R. J. Cava et al.: "Bulk superconductivity at 36K in La1.8Sr0.2CuO4".

*Primary Examiner*—Paul Lieberman
*Assistant Examiner*—Linda D. Skaling
*Attorney, Agent, or Firm*—Kenyon & Kenyon

[57] ABSTRACT

A superconducting mixed valence copper oxide, having a formula of the type:

$$(La_{2-x}(Y_{x''}Bi_{1-x''})_{x'}Sr_{x-x'})_{1-e}CuO_{4-y},$$

where:
 $0 \leq x < 0.3$
 $0 \leq x' \leq 0.2$ with $x' < x$
 $0 \leq x'' \leq 1$
 $0 < y \leq 0.1$
 $0 \leq e \leq 0.005$.

1 Claim, 2 Drawing Sheets

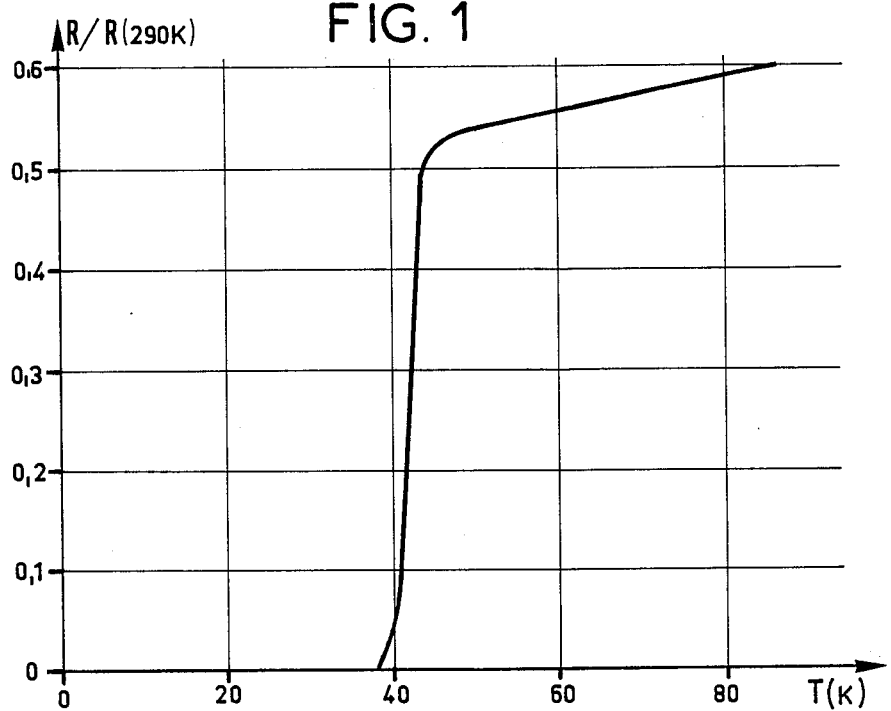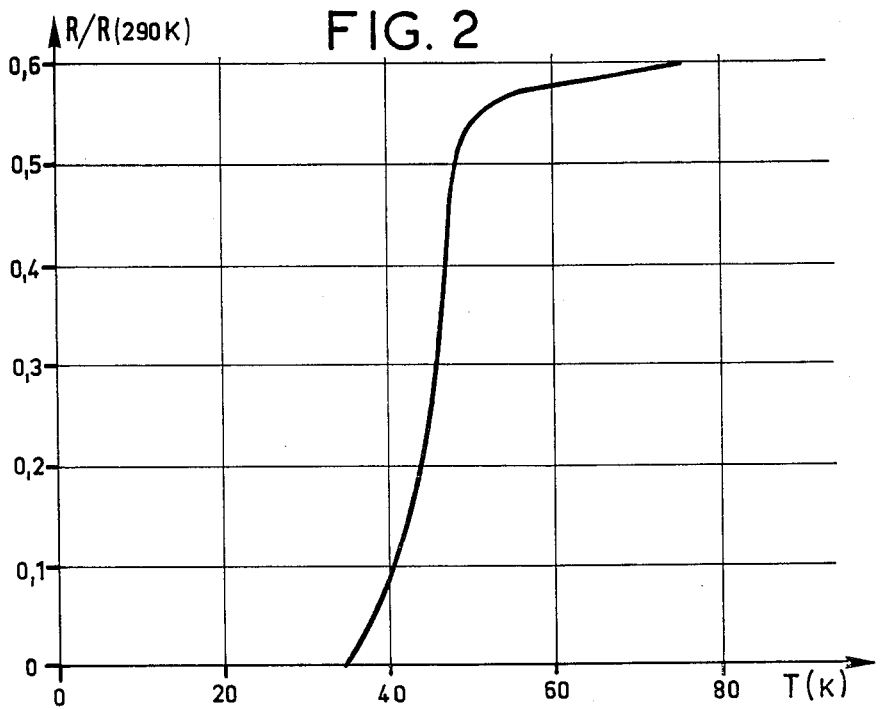

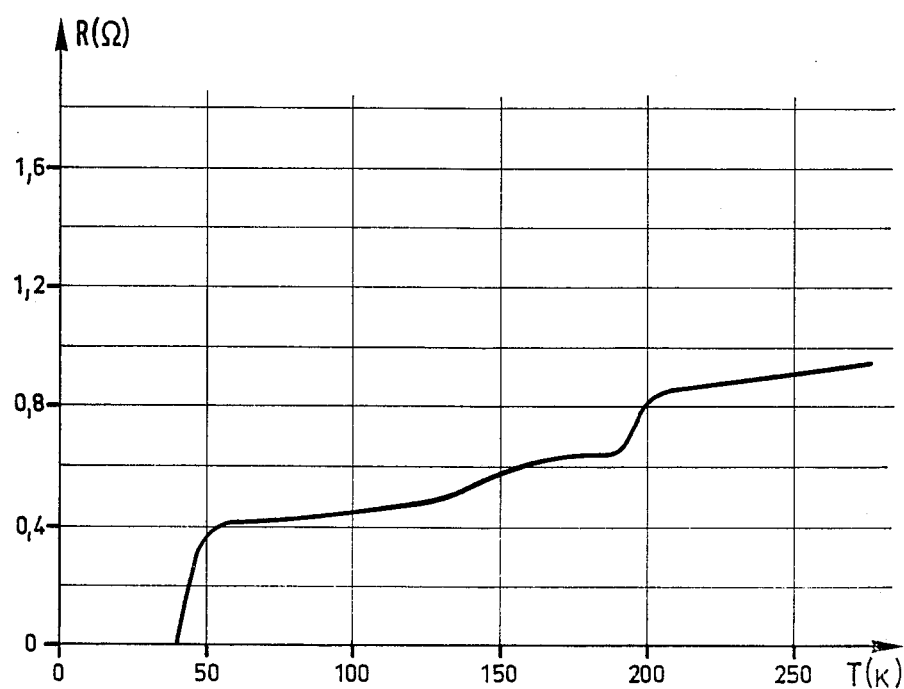

SUPERCONDUCTIVE MIXED VALENCE COPPER OXIDE, AND METHOD OF MAKING IT

The invention relates to a mixed valence copper oxide and to a method of making it.

BACKGROUND OF THE INVENTION

Until 1986, the phenomenon of superconductivity was limited to very low temperature ranges, and more particularly to the use of liquid helium. The record observed critical temperature was 23.3 K. for $Nb_3Ge$ disposed in thin layers. In spite of this handicap, superconductive materials were expected to have numerous high-current applications, in particular in making electromagnets for obtaining intense magnetic fields. These possibilities were greatly reinforced by the discovery around 1970 of superconductive ternary chalcogenides which were studied, in particular, on account of their high critical field strengths.

During the last few years, considerable progress has been achieved in fundamental knowledge about solid-state physics, not only with respect to the interactions between superconductivity and magnetism in ternary chalcogenides, but also in relation to superconducting organic materials.

Mixed valence copper oxides derived from Perovskite have been studied for several years by the Crismat Laboratory at the University of Cannes in the context of new oxides having anisotropic metallic properties. These studies have shown that the preparation of such materials requires two conditions to be met concerning the nature of the element M constituting the lattice for receiving the oxide $MO_n$:

the element M must be suitable for providing mixed valence, i.e. for providing two oxidation states simultaneously. The element is therefore a transition element suitable for electron delocalization in a band constituted from the $dx^2-y^2$ and the $dz^2$ atomic orbitals of the metallic element, and the 2p atomic orbitals of oxygen atoms by Linear Combination Atomic Orbitals (LCAO); and in order to provide anisotropy it must be capable on its own of providing a mixed framework, i.e. of taking up several co-ordination numbers simultaneously. It is under these circumstances that copper was investigated as a possilbe candidate by virtue of its two possible ionization states: comprising the $Cu^{3+}$ ion which is characterized by its aptitude for octahedral co-ordination numbers; and the $Cu^{2+}$ ion for which the Jahn Teller effect allows octahedral, pyramid, and square co-ordination numbers.

A Perovskite framework is advantageous in making anisotropic structures because of its great simplicity, since it is formed solely by octahedrons interconnected at their vertices. In this way, it could be hoped that oxygen deficient Perovskites could be synthesized by creating anion defects in an ordered manner.

An article by Ninh Nguyen, Jacques Choisnet, Maryvonne Hervieu and Bernard Raveau of said Laboratoire de Caen, entitled "Oxygen defect $K_2NiF_4$-type oxides: The compound $La_{2-x}Sr_xCuO_{4-(x/2)+\delta}$" which appeared in "Journal of Solid State Chemistry 39, 120-127, (1981)" is at the origin of this entire structural family. As a result, intergrowth then occurs between oxygen-deficient Perovskite sheets and insulating SrO type stoichiometric sheets. The oxygen-deficient sheets, characterized by simple Perovskite sheets which are isolated by SrO type layers, are genuine two-dimensional conductors in which the anion defects are situated in the base planes of the $CuO_6$ octahedrons.

As described in an article entitled "Mixed Valence Ternary Copper Oxides of the Oxygen-Deficient $K_2NiF_4$ Type: Progressive Evolution from a Conductive State to a Semi-metallic State of $La_{2-x}Sr_xCuO_{4-(x/2)+\delta}$ Oxides" by N. Nguyen, F. Studer, and B. Raveau published in "Physs-chem. Solids" vol. 44 No. 5, pages 389-400, 1983, derived mixed valence ternary copper oxides of the $K_2NiF_4$ type are characterized by a high defect density which extends over a wide range of electrical properties running from a semiconductor state to a semimetallic state, depending on the oxygen pressure to which they are subjected. The results obtained in this way, and previously obtained results for the following oxides: $La_3Ba_3Cu_6O_{14+y}$ and $La_{2-x}Sr_xCuO_{4-(x/2)\cdot\delta}$ show that such properties may be generalized to numerous ternary copper oxides characterized by a Perovskite derived structure either by creation of defects or else by intergrowth. The electrical properties of $La_{2-x}A_xCuO_{4-x/2+\delta}$ oxides, in particular the properties of strontium compounds between 100 K. and 300 K. show that at low substitution rates (x<0.3) the metallic conductivities at ordinary temperatures are two orders of magnitude greater than those of the oxide $La_2CuO_4$.

While studying superconductivity in oxides having the composition $BaLa_{5-x}Cu_5O_{5(3-y)}$ two Swiss physicists Bednorz and Muller demonstrated a restrictive transition at 30 K., with the temperature being reduced by applying high density measurement currents. In an article entitled "Possible High Tc Superconductivity in the Ba-La-Cu-O System" (Z. Phys. B, Condensed Matter, 64, 189-193, 1986), they consider oxygen-deficient metallic compounds in the Ba-La-Cu-O system, using the composition $Ba_xLa_{5-x}Cu_5O_{5(3-y)}$ prepared in polycrystalline form. Samples having x=1 and x=0.75, with y>0, and annealed at 900° C. under reducing conditions, comprise three phases, one of which is a Perovskite type mixed valence copper compound. On being cooled, the samples demonstrate a linear decrease in resistivity, followed by a substantially logarithmic decrease which is interpreted as being the beginning of localization. Finally, a sudden decrease occurs through up to three orders of magnitude, indicative of a percolative superconductivity transition. The highest transition temperature observed was in the 30 K. range. The transition temperature is considerably reduced at high current densities. The authors believe that these properties thus result in part from the percolative nature, but may also result from 2D superconductive fluctuations in the double Perovskite layers of one of the phases present.

Superconducting oxides having a high critical temperature Tc have been discovered very recently in this way. The leading example is the oxide $La_{2-x}Sr_xCuO_{4-y}$ whose superconducting properties have been described by R. J. Cava, R. B. Van Dover, B. Batlogg, and E. A. Rietman in an article entitled "Bulk Superconductivity at 36 K. in $La_{1.8}Sr_{0.2}CuO_4$ ("Physical Review Letters", volume 58, number 4, 26 January 1987). This article describes the result of resistivity measurements and magnetic susceptibility measurements for the compound $La_{2-x}Sr_xCuO_4$ for $x \leq 0.3$. The sample for x=0.2 has a superconductive transition at 36.2 K. over a width of 1.4 K. The associated diamagnetic susceptibility dc (Meisser effect) reaches a high fraction (60%–70%) of the ideal value. The authors estimate the density of states from the critical field and the resistivity values, and suggest, by an analogy with the compound $BaPb_{-x}Bi_xO_3$, that conventional superconductivity is capable of explaining the high critical temperature in this class of materials.

The object of the present invention is to improve these characteristics, in particular the critical temperature Tc and/or the critical current, and also the sintering temperature.

SUMMARY OF THE INVENTION

To this end, the present invention provides a superconducting mixed valence copper oxide, having a formula of the type:

$$(La_{2-x}(Y_{x''}Bi_{1-x''})_{x'}Sr_{x-x'})_{1-e}CuO_{4-y},$$

where:
$0 \leq x < 0.3$
$0 \leq x' \leq 0.2$ with $x' < x$
$0 \leq x'' \leq 1$
$0 < y \leq 0.1$
$0 \leq e \leq 0.05$.

Such compounds provide considerable technological progress both in high current applications, in particular in the making of magnets where they may be used in the form of wires, and also in electronic applications where the provision of thin layers may become very important.

Substituting Bismuth for Lanthane makes it possible:
to improve the superconductive properties of the phases; and
to reduce the sintering temperature, thereby facilitating the manufacture of the ceramics and possible also facilitating wire drawing.

The invention also provides a method of making such materials.

BRIEF DESCRIPTION OF THE DRAWINGS

The characteristics and advantages of the invention appear more clearly from the following description given by way of non-limiting example with reference to the accompanying drawings, in which:

FIGS. 1 to 3 are graphs showing the characteristics of materials in accordance with the invention.

MORE DETAILED DESCRIPTION $La_{2-x}Bi_{x'}Sr_{x-x'}CuO_{4-y}$ oxides were synthesized by reacting the oxides $La_2O_3$, $Bi_2O_3$, and $CuO$ with Strontium carbonate by sintering in air at temperatures lying between 950° C. and 1000° C.

The sintered products are annealed in air or oxygen at 400° C. and superconducting properties are obtained for:
$0 \leq x \leq 0.3$
$0 \leq x' \leq 0.2$ and $x' < x$
$0 < y \leq 0.1$ The oxide $La_{1.7}Bi_{0.1}Sr_{0.2}CuO_{4-y}$ may be considered as being an excellent superconductor having a critical temperature $Tc \approx 42$ K. and capable of withstanding relatively high critical currents: the superconducting state can be retained at current densities of up to 10 $A/cm^2$. FIG. 1 is a graph relating to such a compound with Tc=42 K.; measurement i=0.5 mA; R(290 K.)=0.26Ω, giving a resistivity $\rho$(290 K.)=7.4×10$^{-3}$ αcm.

For $x > 0.3$, higher critical tempertures can be obtained, but the superconductive effect is not stable.

Thus, for the compound $La_{1.6}Bi_{0.1}Sr_{0.3}CuO_{4-y}$, a resistive transition being about 100 K. and terminating at about 80 K. has been observed. This transition disappears after several measurement cycles.

The oxides $La_{2-x}Y_{x'}Sr_{x-x'}CuO_{4-y}$ have been synthesized by reacting the oxides $La_2O_3$, $Y_2O_3$, and CuO with Strontium carbonate by sintering in air at 1050° C., and then cooling slowly in oxygen at a speed of 30° C./h.

The properties observed were very similar to those observed for the bismuth phases. The corresponding range is very similar:
$0 \leq x \leq 0.30$
$0 \leq x' \leq 0.20$ with $x' < x$
$0 < y \leq 0.1$ Thus, the phases $La_{1.75}Y_{0.05}Sr_{0.2}CuO_{4-y}$ and $La_{1.70}Y_{0.10}Sr_{0.2}CuO_{4-y}$ are characterized by critical temperature of 46 K. These materials withstand current densities of 4 $A/cm^2$ at 20 K. FIG. 2 is a graph relating to the compound $La_{1.7}Y_{0.10}Sr_{0.2}CuO_{4-y}$ with Tc=46 K. Measurement i=1 mA; R(290 K.)=0.21Ω, giving $\rho$(290 K.)= 2×10$^{-2}$Ωcm.

The oxides $La_{2-x}(Y_{x''}Bi_{1-x''})_{x'}Sr_{x-x'}CuO_{4-y}$ with:
$0 \leq x'' \leq 1$
$0 \leq x \leq 0.30$
$0 \leq x' \leq 0.20$ with $x' < x$
$0 \leq y \leq 0.1$
have been obtained using a synthesis method identical to that decribed for obtaining compounds of the type $La_{2-x}Bi_{x'}Sr_{x-x'}CuO_{4-y}$. FIG. 3 is a graph relating to a compound:

$$La_{1.7}Bi_{0.05}Y_{0.05}Sr_{0.02}CuO_4$$

with $\rho$(290 K.)=7.4×10$^{-3}$ Ωcm.

It must be underlined that by using compounds of the type described above, the sintering temperature is considerably reduced to 950° C.–1000° C., and much better densification of the material is obtained due to the presence of bismuth.

Bulk superconducitivity can be considerably improved by varying the stoichiometry, i.e. the ratio:

$$\frac{La + Bi + Y + Sr}{Cu} = 2(1 - e)$$

Depending on operating conditions the following general formula is obtained:

$$(La_{2-x}(Y_{x''}Bi_{1-x''})_{x'}Sr_{x-x''})_{1-e}CuO_{4-y}$$

with $0 \leq e \leq 0.5$.

We claim:
1. A superconducting mixed valence copper oxide having the general formula

$$(La_{2-x}(Y_{4''}Bi_{1-x''})_{x'}Sr_{x-x'})_{1-e}CuO_{4-y},$$

wherein:
$0 < x < 0.3$
$0 < x' \leq 0.2$ with $x' < x$
$0 \leq x'' < 1$
$0 < y \leq 0.1$
$0 \leq e \leq 0.05$.

* * * * *

UNITED STATES PATENT AND TRADEMARK OFFICE
CERTIFICATE OF CORRECTION

PATENT NO. : 4,843,059
DATED : September 27, 1989
INVENTOR(S) : Francis Deslandes, et al.

It is certified that error appears in the above-identified patent and that said Letters Patent is hereby corrected as shown below:

Title Page, Col. 1, 4th line from bottom:
change "than $T_e$ Sperconductors"

to -- High $T_c$ Superconductors --.

Col. 2, line 66: change "Meisser" to Meissner.

Col. 3, line 2: change "$BaPb_{-x}$" to -- $BaPb_{1-x}$ --.

Col. 4, line 4: change "being" to -- beginning at --.

Col. 4, line 29: change "$0 \leqq y \leq 0.1$" to read --$0 < y \leq 0.1$--.

Col. 4, line 37: change "$10^{-3} \Omega cm$" to -- $10^{-3} \Omega$ cm. --.

Col. 4, line 58: change "$Y_4$" to -- $Y_x$ --.

Signed and Sealed this

Nineteenth Day of June, 1990

*Attest:*

HARRY F. MANBECK, JR.

*Attesting Officer*  *Commissioner of Patents and Trademarks*